(12) United States Patent  
Chung et al.

(10) Patent No.: US 9,390,764 B2  
(45) Date of Patent: Jul. 12, 2016

(54) STORAGE APPARATUS AND PRODUCTION METHOD THEREOF

(71) Applicant: PHISON ELECTRONICS CORP., Miaoli (TW)

(72) Inventors: Hung-I Chung, Hsinchu County (TW); Chang-Chih Chen, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 449 days.

(21) Appl. No.: 14/016,211

(22) Filed: Sep. 2, 2013

(65) Prior Publication Data

US 2015/0003003 A1    Jan. 1, 2015

(30) Foreign Application Priority Data

Jun. 27, 2013  (TW) .............................. 102122984 A

(51) Int. Cl.  
    *G11C 5/04*     (2006.01)  
    *H05K 1/11*     (2006.01)  
    *H01R 12/71*     (2011.01)  
    *H01R 13/66*     (2006.01)

(52) U.S. Cl.  
    CPC ................ *G11C 5/04* (2013.01); *H01R 12/714* (2013.01); *H01R 13/6683* (2013.01); *H05K 1/117* (2013.01); *H05K 2201/094* (2013.01); *H05K 2201/09409* (2013.01); *Y10T 29/49069* (2015.01)

(58) Field of Classification Search  
    CPC ............................ H01R 12/722; H01R 12/737  
    See application file for complete search history.

(56) References Cited

U.S. PATENT DOCUMENTS

2009/0093136 A1 * 4/2009 Hiew .................... G06F 1/1632  
    439/55

* cited by examiner

*Primary Examiner* — Truc Nguyen  
(74) *Attorney, Agent, or Firm* — Jianq Chyun IP Office

(57) ABSTRACT

A storage apparatus including a storage element and a fitting member is provided. The storage element includes a body, a first pad set and a second pad set. The first and the second pad sets are exposed out of the body and located at opposite sides of the body. The fitting member comprises a first terminal set and a second terminal set electrically connected to each other. The storage element is detachably assembled to the fitting member. The first terminal set electrically connected to the first pad set and the second terminal set located between the first pad set and the second pad set, the second terminal set and the second pad set form a connecting interface of the storage apparatus that the storage apparatus is used for being electrically connected to an external apparatus. A production method of the storage apparatus is further provided.

20 Claims, 9 Drawing Sheets

STORAGE APPARATUS AND PRODUCTION METHOD THEREOF

CROSS-REFERENCE TO RELATED APPLICATION

This application claims the priority benefit of Taiwan application serial no. 102122984, filed on Jun. 27, 2013. The entirety of the above-mentioned patent application is hereby incorporated by reference herein and made a part of this specification.

BACKGROUND OF THE INVENTION

1. Technology Field

The present invention relates to a storage apparatus and a production method thereof.

2. Description of Related Art

With development of multi-media technologies, storage capacity required for digital data goes larger and larger. Conventional floppy disk in 1.44 MB features in its portable characteristics but fails to meet the requirement of large storage capacity. Although a conventional hard disk provides a large storage capacity, it still suffers in bulk size which leads to inconvenient carrying. A rewritable nonvolatile memory has the characteristics of data non-volatility, low power consumption, compact size, and non-mechanical structure. Hence, the rewritable nonvolatile memory is adapted for portable appliances, especially portable products powered by batteries. A flash drive is a storage apparatus adopting NAND flash memory as its storage medium.

Generally speaking, the flash drive includes a circuit board, electronic devices and a plurality of elastic terminals and metal conductive plates (also known as connectors or connecting interfaces) configured to connect a host. Although a size of the flash drive may be adaptively reduced by minimizing the circuit board, there are still difficulties in further miniaturizing the size of the flash drive due to dimensions of the metal casing of the connectors. Therefore, a solution as how to simplify an assembled structure of the flash drive and an assembly process thereof to achieve the reduction of the dimension of the flash drive as well the increase of the convenience when in use has become one of the major subjects in the industry for person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

Accordingly, the present invention is directed to a storage apparatus capable of effectively reducing the size and improving the convenience and the applicability by a simple structure configuration thereof.

Accordingly, the present invention is directed to a method of manufacturing a storage apparatus and has a simplified manufacturing process.

One exemplary embodiment of the present invention provides a storage apparatus including a storage element and a fitting member. The storage element has a body, a first pad set and a second pad set. The first pad set and the second pad set are exposed out of the body and located at opposite sides of the body. The fitting member has a first terminal set and a second terminal set which are electrically connected to each other. The storage element is detachably assembled to the fitting member. The first terminal set is electrically connected to the first pad set. The second terminal set is located between the first pad set and the second pad set. The second terminal set and the second pad set form a connecting interface for the storage apparatus to electrically connect with an external apparatus. The fitting member is a U-shaped structure and has a connection part and a carrying part located at opposite sides of the U-shaped structure. The body is located between the connection part and the carrying part so that the storage element is disposed in the U-shaped structure, and the first terminal set and the second terminal set are formed in the connection part and extended toward opposite directions.

One exemplary embodiment of the present invention provides a production method of the storage apparatus. The production method includes assembling the storage element to the fitting member. The first terminal set and the first pad set are electrically connected to each other, the second terminal set is located between the first pad set and the second pad set, and the second terminal set and the second pad set form a connecting interface for the storage apparatus to electrically connect with an external apparatus.

In the exemplary embodiments of the present invention, the storage apparatus is simply formed by the storage element and the fitting member, the first pad set and the second pad set are disposed on the storage element, and the first terminal set and the second terminal set are disposed on the fitting member, so that when assembling the storage element to the fitting member, the first terminal set is electrically connected to the first pad set, and the connecting interface for the storage apparatus to connect with an external electronic apparatus is formed by the second terminal set and the second pad set. Accordingly, the dimension of the assembled storage apparatus and the space occupied thereby is reduced by the stacked storage element and the fitting member, and the corresponding relationship between the terminal sets and the pad sets. Furthermore, the storage element is detachably assembled to the fitting member, and hence, the user may replace or repair the two parts according to the needs without being limited by what fixing means, such as welding and so on, is used. Thus, the convenience and the applicability of the storage apparatus are improved.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAIL DESCRIPTION OF DISCLOSED EMBODIMENTS

Figure 1:
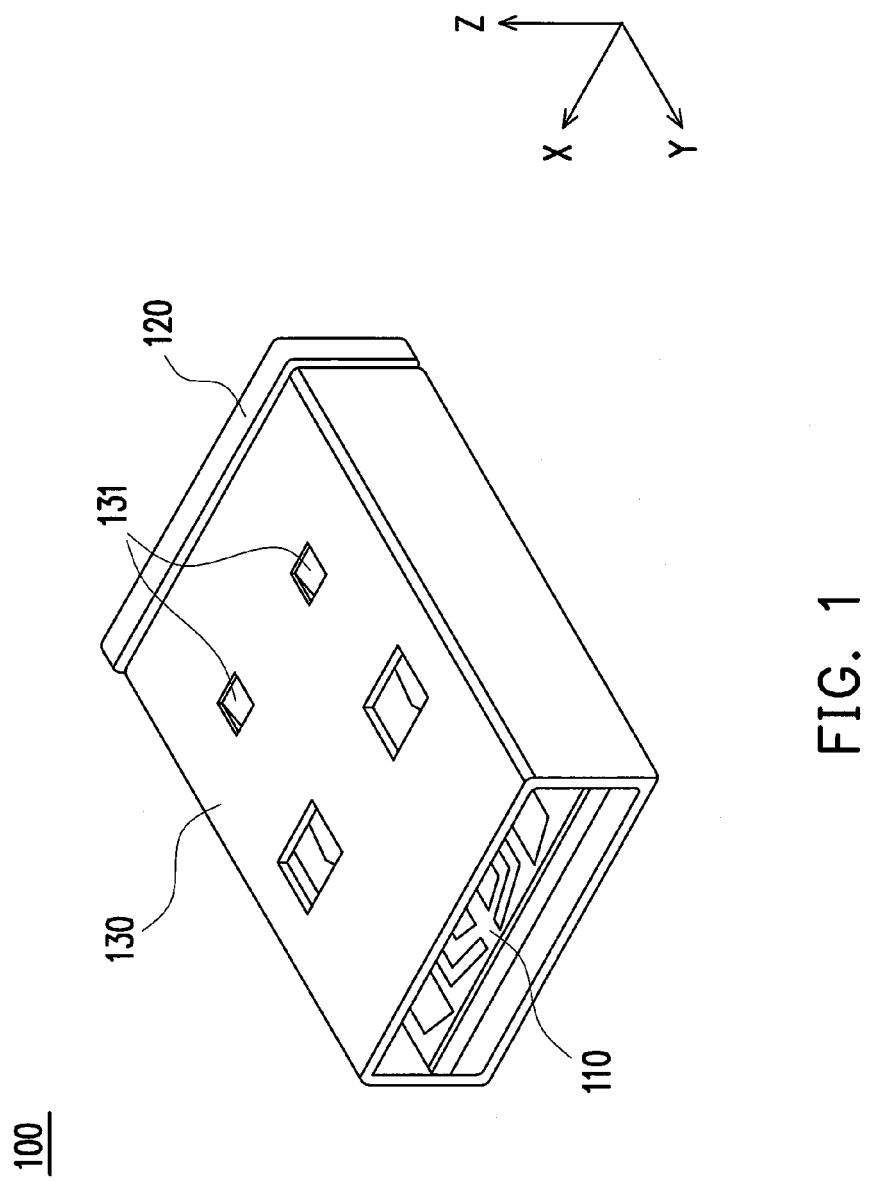
FIG. 1 is a schematic diagram of a storage apparatus according to one exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
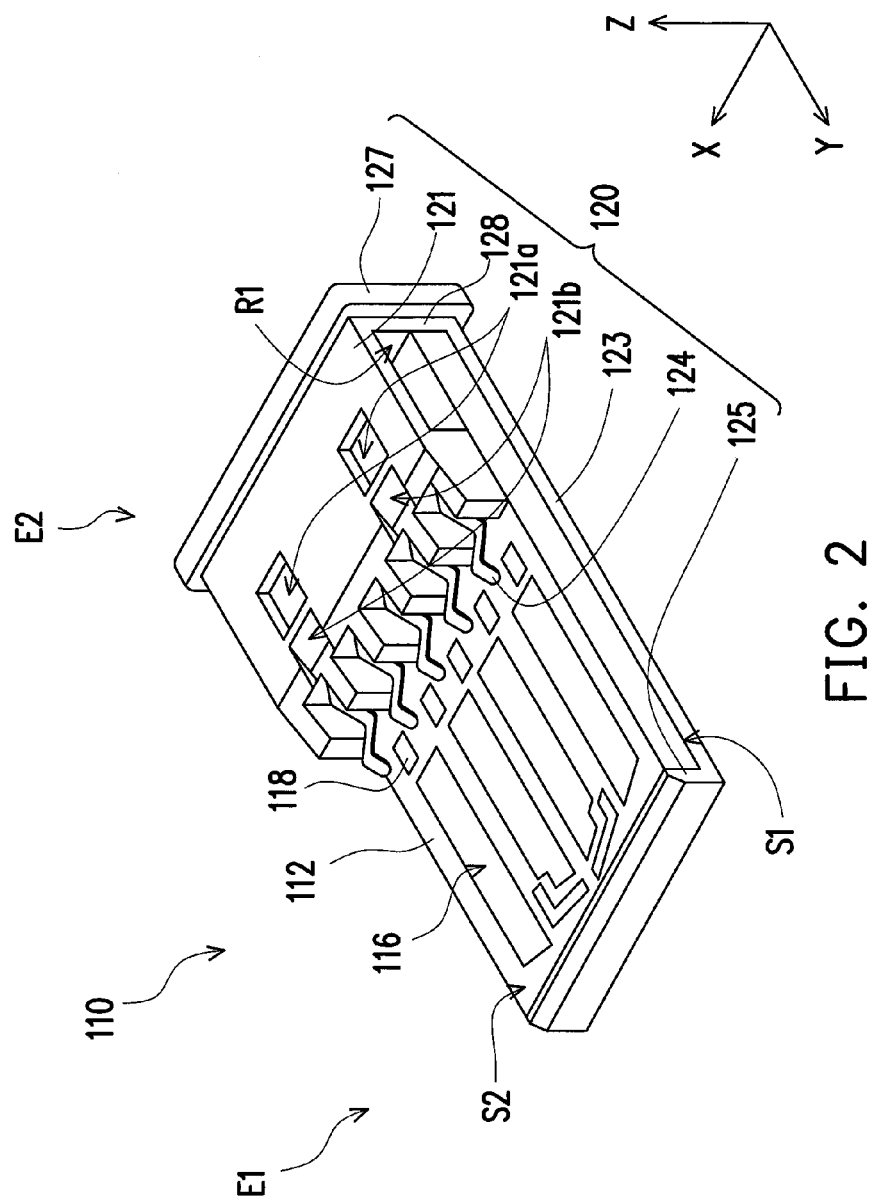
FIG. 2 and FIG. 3 are schematic diagrams respectively illustrating portions of the components of the storage apparatus depicted in FIG. 1 in different viewing angles.
Figure 3:
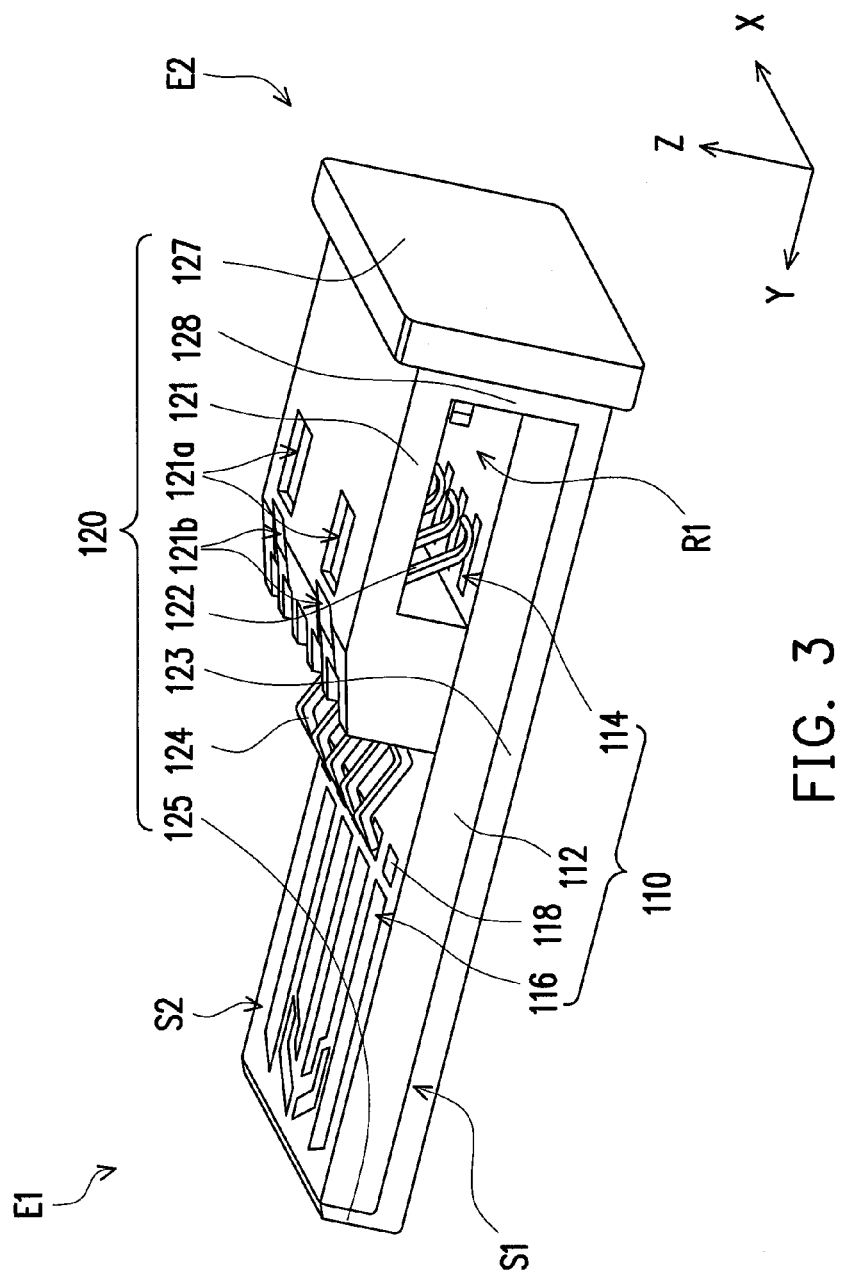
Figure 4:
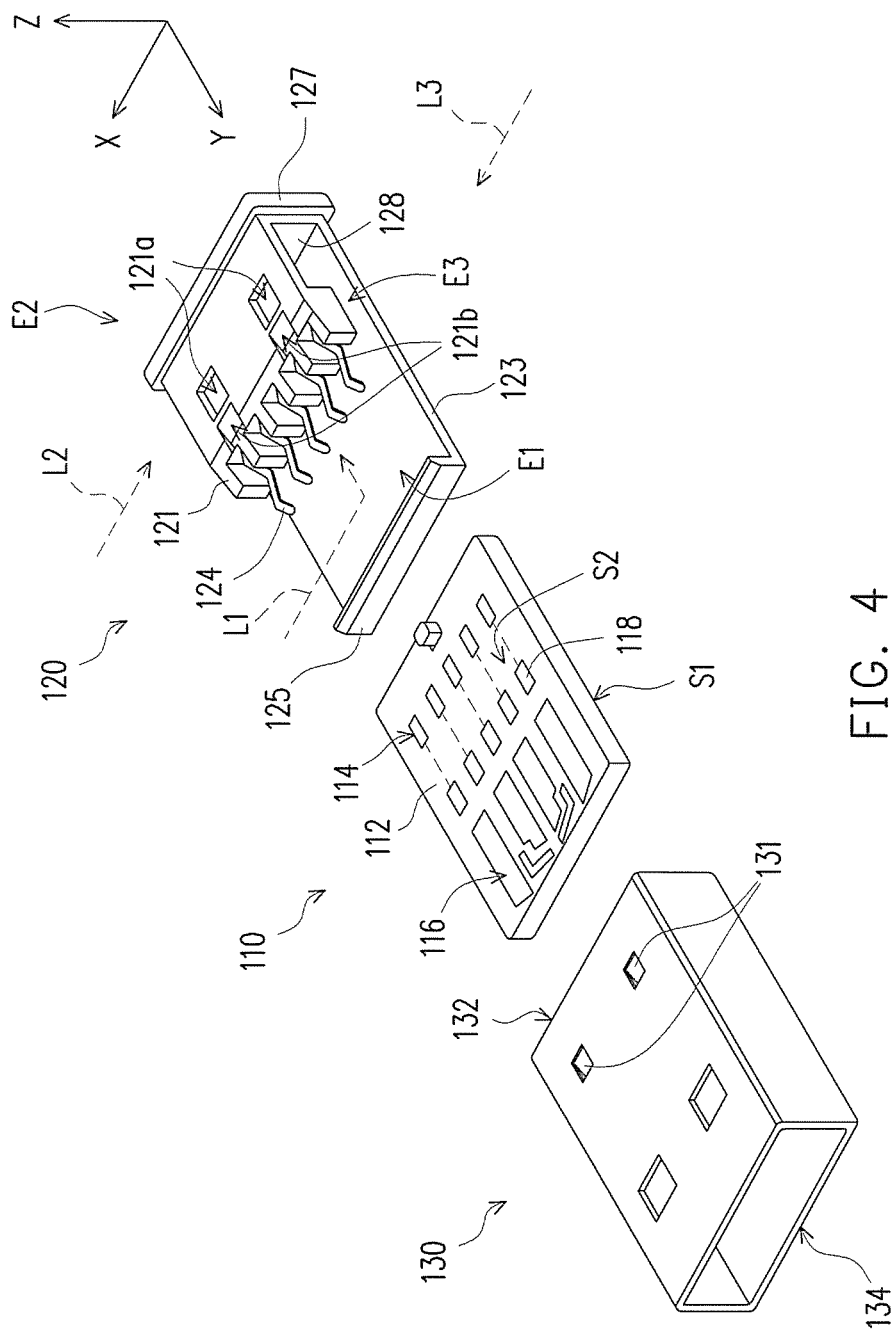
FIG. 4 is an exploded diagram of the storage apparatus depicted in FIG. 1.

FIG. 1 is a schematic diagram of a storage apparatus according to one exemplary embodiment of the present invention. FIG. 2 and FIG. 3 are schematic diagrams respectively illustrating portions of the components of the storage apparatus depicted in FIG. 1 in different viewing angles. FIG. 4 is an exploded diagram of the storage apparatus depicted in FIG. 1. Referring to FIG. 1 through FIG. 4, in the present exemplary embodiment, a storage apparatus 100, a flash drive for example, includes a storage element 110, a fitting member 120, and a casing 130. Here, the storage element 110 is detachably assembled into the fitting member 120. The casing 130 covers the fitting member 120, and the storage element 110 is contained in the casing 130. For conveniently describing related components, a Cartesian coordinate system will be incorporated in the following exemplary embodiments and diagrams. Meanwhile, the storage apparatus 100 is located on a X-Y plane as a reference for later description.

In the present exemplary embodiment, the storage element 110 has a body 112, and a first pad set 114 and a second pad set 116 that both are exposed out of the body 112. Here, a system in package (SIP) technology is employed to construct various types of electronic elements, such as a storage unit (e.g. a flash memory) and a control circuit, of the storage element 110 of the present exemplary embodiment into a systematic integrated package by the use of plastic, metal, and ceramics material or epoxy resin, so as to protect the electronic elements in the package structure. The first pad set 114 and the second pad set 116 are configured as connecting interfaces for the storage element 110 to electrically connect with an external apparatus. The second pad set 116 conforms to the universal serial bus 2.0 (USB 2.0) standard.

The fitting member 120 has a first terminal set 122 and a second terminal set 124 that are electrically connected to each other. Furthermore, the fitting member 120 is a U-shaped structure and has a first terminal E1 and a second terminal E2. As illustrated in FIG. 4, the fitting member 120 is in an open state at the first terminal E1, which is adaptively configured as an entrance or an exit for detaching or assembling the storage element 110, and the fitting member 120 is in a close state at the second terminal E2. In the present exemplary embodiment, the fitting member 120 further has a connection part 121 and a carrying part 123, which are respectively located at opposite sides of the U-shaped structure. The connection part 121 and the carrying part 123 are vertically disposed along a Z-axis (wherein the carrying part 123 is considered as being located on the X-Y plane). Additionally, the first terminal set 122 and the second terminal set 124 are disposed and correspondingly connected with each other in the connection part 121. Each terminal of the first terminal set 122 connects to a corresponding terminal of the second terminal set 124, and are formed in an integral structure, wherein the first terminal set 122 and the second terminal set 124 are formed by an in-mold injection process in the connection part 121 and extended toward opposite directions. In other words, the connection part 121 and the carrying part 123 of the fitting member 120 are manufactured by utilizing an integral manufacturing technique to form a U-shaped structure. During the process of forming the connection part 121, the first terminal set 122 and the second terminal set 124 are embedded therein so that the first terminal set 122 and the second terminal set 124 form a portion of the structure of the fitting member 120.

In the present exemplary embodiment, the fitting member 120 further has a first stopper part 125 and a sealing part 127. The sealing part 127 is located on the second terminal E2 of the U-shaped structure and adjacent to the connection part 121 and the carrying part 123. The first stopper part 125 is located on the first terminal E1 of the U-shaped structure and connected to the carrying part 123. Correspondingly, the casing 130 has a first opening 132 and a second opening 134, and the casing 130 is connected with the fitting member 120 through the first opening 132, so that the sealing part 127 seals the first opening 132.

Referring to FIG. 2 through FIG. 4, when the storage element 110 is assembled to the fitting member 120, two opposite surfaces, a first surface S1 and a second surface S2, of the body 112 of the storage element 110 contacts the carrying part 123 and the connection part 121 respectively. That is, the body 112 is carried on the carrying part 123 through the first surface S1, and the connection part 121 contacts the second surface S2 of the body 112 so that the storage element 110 is clamped in the U-shaped structure. In the meantime, the first stopper part 125 standing on the carrying part 123 also contacts a front end of the storage element 110, while a back end of the storage element 110 contacts the second stopper part 128 of the U-shaped structure (Here, the front and back ends of the storage element 110 are extended along the Y-axis). Accordingly, the fitting member 120 clamps the storage element 110 not only with the connection part 121 and the carrying part 123 along the Z-axis, but also with the first stopper part 125 and the second stopper part 128 along the Y-axis.

Furthermore, when the casing 130 and the fitting member 120 are connected with each other, the casing 130 also contacts the connection part 121 and the carrying part 123 of the fitting member 120 so as to enhance the effect for the connection part 121 and the carrying part 123 to clamp and fix the storage element 110 along the Z-axis. In the meantime, the casing 130 also applies a clamping force along the X-axis to the storage element 110 and the fitting member 120.

On the other hand, the casing 130 further has an tongue piece 131 formed by, for example, pressing the surface of the casing 130 to form an elastic protruding structure which extends inward the casing 130. The connection part 121 of the fitting member 120 also has a concave slot 121*a* and a guiding part 121*b* corresponding to the tongue piece 131. Thus, when the fitting member 120 and the casing 130 are assembled to each other, the tongue piece 131 is guided to the guiding part 121*b*, bended due to being pressed by the guiding part 121*b* firstly, and then correspondingly locked in the concave slot 121*a* due to a restoring force of the tongue piece 131. Thereby, the fitting member 120 may be stably locked in the casing 130 and prevented from falling off.

Accordingly, the body 112 of the storage element 110 is carried on the carrying part 123. That is, the storage element 110 contacts one side of the U-shaped structure. Additionally, the storage element 110 merely contacts a portion of the connection part 121, and hence, a containing space R1 is formed therebetween. The first terminal set 122 and the first pad set 114 are electrically connected with each other in the containing space R1. Here, the first terminal set 122 is an elastic structure formed by bending a metal piece. Certainly, it may also be formed by using a material having both conductivity and elasticity from current technologies. By doing so, the interference of the first terminal set 122 and the first pad set 114 is absorbed due to the elasticity of the first terminal set 122 so as to prevent the first terminal set 122 and the first pad set 114 from damages.

In addition, the second terminal set 124 extended in a direction opposite to the first terminal set 122 is located outside of the containing space R1 and further forms a connection interface with the second pad set 116 located outside of the containing space R1. The connecting interface is configured for the storage apparatus 100 to electrically connect with an external apparatus (not shown). In the present exemplary embodiment, the second terminal set 124 and the second pad set 116 form the connecting interface conforming to the Universal Serial Bus 3.0 standard.

Based on the above description, the storage element 110 of the present exemplary embodiment is detachably assembled to the fitting member 120, so that by the contacting relationship between the first terminal set 122 and the first pad set 114, an electrical connection relationship is generated between the fitting member 120 and the storage element 110. As the result, the second terminal set 124 and the second pad set 116 of the storage element 110 form a connecting interface for the storage apparatus to connect with an external apparatus. By doing so, the dimension of the storage apparatus 100 may be effectively reduced with such a simple stacking structure, the related terminal sets and pad sets may be properly positioned with the aforementioned assembly structures, and the storage apparatus 100 may have better adaptability due to having the detachable structures. That is, a user may conveniently replace or repair the fitting member 120 or the storage element 110 to meet all kinds of needs.

In addition, the storage element 110 further has a third pad set 118 disposed on the surface S2, located between the first pad set 114 and the second pad set 116. Pads of the third pad set 118 are arranged in a direction parallel to that of arranging pads of the first pad set 114. Each pad of the third pad set 118 and each terminal of the second terminal set 124 are arranged and disposed in a one-to-one manner and each pad is separated from each corresponding terminal with a gap. In the present exemplary embodiment, the third pad set 118 is dummy pad set, and not electrically connected with electric devices in the storage element 110. Accordingly, when the storage apparatus 100 is connected with another electronic apparatus, the second terminal set 124 is pressed and bended and contacts the second surface S2. In this case, the third pad set 118 is served as a contacting and supporting structure for the second terminal set 124 so as to prevent the body of the storage element 110, even the electronic devices therein, from damages due to the second terminal set 124 directly contacting the second surface S2. However, in another exemplary embodiment of the present invention, the third pad set 118 is electrically connected with the first pad set 114. In other words, the second terminal set 124 forms a connection interface conforming to USB 3.0 standard with the second pad set 116 when directly contacting the third pad set 118. By doing so, an issue of malfunction issue due to bad electrical connection between the first pad set 114 and the first terminal set 122 that is resulted from the aging of the first terminal set 122 may be prevented.

Figure 5:
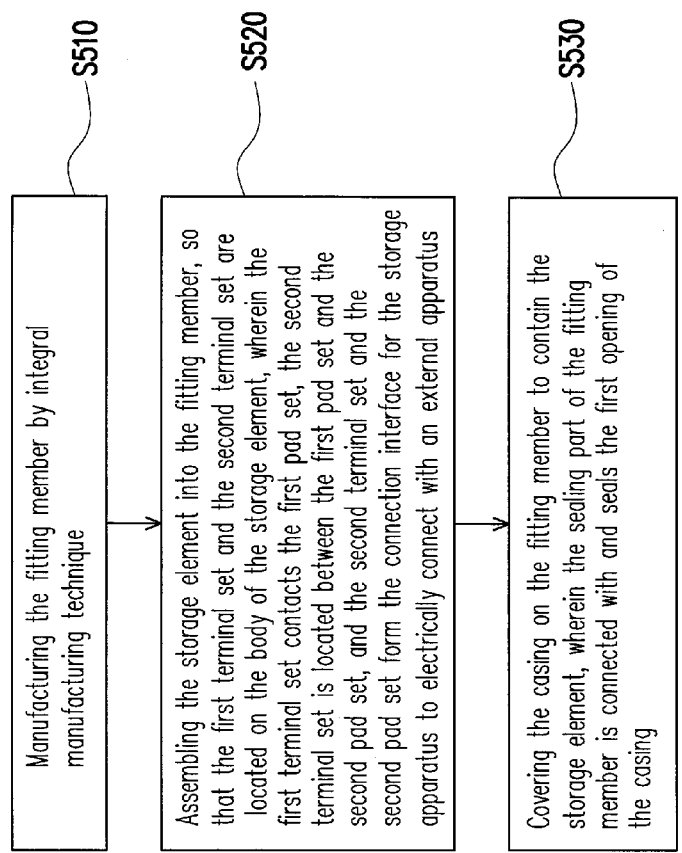
FIG. 5 is a flowchart illustrating a process of manufacturing a storage apparatus according to one exemplary embodiment of the present invention.

FIG. 5 is a flowchart illustrating a process of manufacturing a storage apparatus according to one exemplary embodiment of the present invention. Referring to FIG. 4 and FIG. 5, in the present exemplary embodiment, the structural characteristics of the storage apparatus 100 are described above. Accordingly, in step S510, the fitting member 120 is first manufactured by an integral manufacturing technique, and the connection part 121, the carrying part 123 and the first terminal set 122 and the second terminal set 124 which are embedded in the connection part 123 are formed. Next, in step S520, the storage element 110 is assembled to the fitting member 120 so that the first terminal set 122 and the second terminal set 124 are disposed on the body 112 of the storage element 110. The first terminal set 122 contacts the first pad set 114, and the second terminal set 124 is located between the first pad set 114 and the second pad set 116. The second terminal set 124 and the second pad set 116 form the connecting interface for the storage apparatus 100 to electrically connect with an external apparatus. Then, in step S530, the casing 130 covers the fitting member 120 so as to contain the storage element 110. The sealing part 127 of the fitting member 120 is connected with and seals the first opening 132 of the casing 130.

Moreover, in the fitting member 120 of the present exemplary embodiment, an area of orthogonal projection of the connection part 121 onto the body 112 of the storage element 110 is smaller than that of the carrying part 123 onto the body 112. That is, as illustrated in FIG. 4, an area of orthogonal projection of the connection part 121 onto the X-Y plane is smaller than that of the carrying part 123 onto the X-Y plane, so that in the structure of the fitting member 120, the carrying part 123 is greater than the connection part 121.

Additionally, due to the first stopper part 125 vertically disposed on the carrying part 123, the storage element 110 has to be assembled into the U-shaped structure along a path L1. That is, one end of the storage element 110 has to be slantwise (i.e., in this case, the storage element 110 is located over the X-Y plane with an angle relative to the X-Y plane) moved from the top of the carrying part 123 to the first terminal E1 of the U-shaped structure. Next, the end of the storage element 110 is moved horizontally from the first terminal E1 toward the second terminal E2 (i.e., the storage element 110 is moved along a direction parallel to the X-Y plane), and the storage element 110 is assembled to the U-shaped structure.

In another exemplary embodiment that is not shown, the carrying part is flexible due to its material properties and thinner thickness. Hence, during the assembly process, the carrying part is bended downward relative to the X-Y plane (base on the viewing angle depicted in FIG. 4), so that the storage element may be assembled into the fitting member by being moved along the Y-axis and in parallel to the X-Y plane.

In addition, the storage element 110 may also be assembled along a path L2 or a path L3, that is, from a side opening E3 between the first terminal E1 and the second terminal E2 (i.e., the storage element 110 is moved along the X-axis, where only a side opening is illustrated) and moved horizontally with respect to the X-Y plane into the U-shaped structure. By doing so, the assembly may also be achieved.

On the other hand, in another exemplary embodiment that is not shown, the fitting member does not have the first stopper part as described above, and therefore, the storage element may be directly moved horizontally along the Y-axis (i.e., in parallel to the X-Y plane) into the U-shaped structure.

Figure 6:
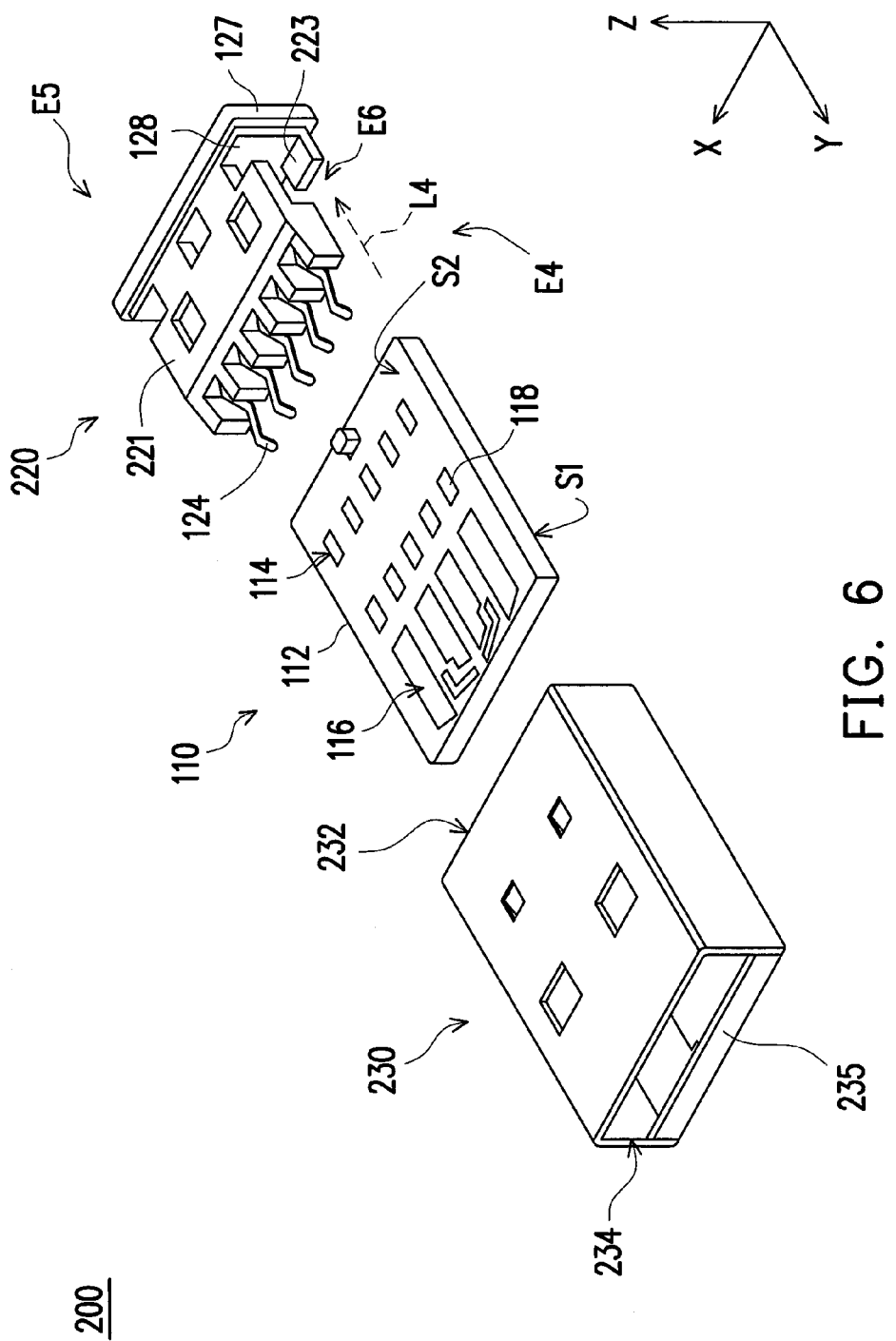
FIG. 6 is an exploded diagram of a storage apparatus according to another exemplary embodiment of the present invention.
Figure 7:
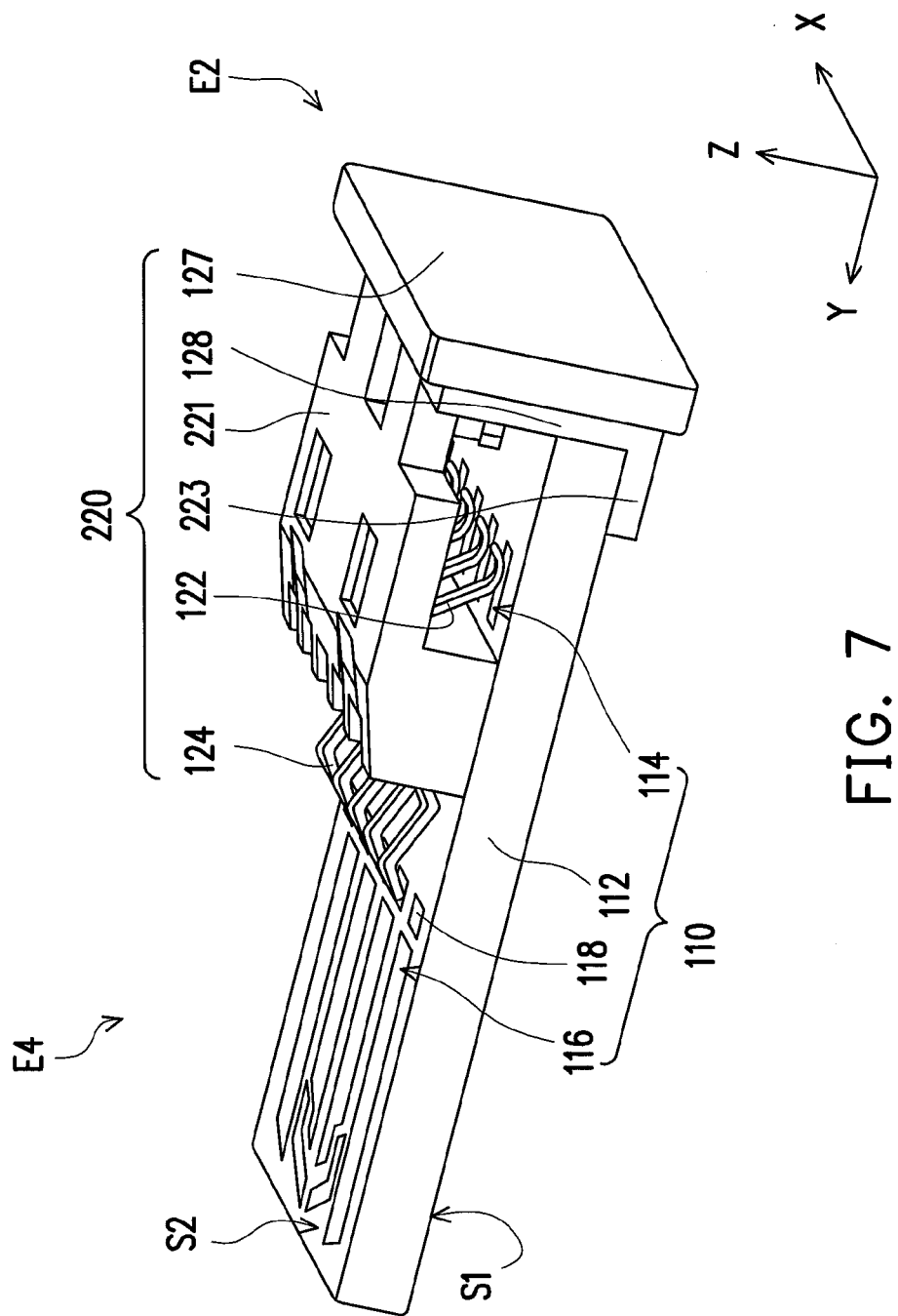
FIG. 7 is a schematic diagram showing portions of the components depicted in FIG. 6 after being assembled.

FIG. 6 is an exploded diagram of a storage apparatus according to another exemplary embodiment of the present invention. FIG. 7 is a schematic diagram showing portions of the components depicted in FIG. 6 after being assembled. Referring to FIG. 6 and FIG. 7 at the same time, differing from the aforementioned exemplary embodiments, in a storage apparatus 200 of the present exemplary embodiment, an area of orthogonal projection of a connection part 221 of a fitting member 220 onto the body 112 of the storage element 110 is greater than that of a carrying part 223 of the fitting member 220 onto the body 112, i.e., an unsymmetrical U-shaped structure where the connection part 221 is greater than the carrying part 223 presented in FIG. 6 and FIG. 7. Accordingly, the storage element 110 is merely assembled into the fitting member 220 along a path L4, i.e., the storage element 110 is merely assembled to the fitting member 220 horizontally along the Y-axis and in parallel to the X-Y plane.

Certainly, similar to the above exemplary embodiments, the storage element 110 may also be assembled into the fitting member 220 along a side opening E6 between a first terminal E4 and a second terminal E5. It is to be mentioned that when assembling the storage element 110 into the U-shaped structure of the fitting member 220, the storage element 110, similarly to the above exemplary embodiments, contacts the carrying part 223 with the first surface S1, and the connection part 221 contacts the second surface S2 of the storage element 110.

In addition, a casing 230 of the present exemplary embodiment has a third stopper part 235 which located in the second opening 234 and formed by, for example, bending a portion of the bottom of the casing 230 (with reference to FIG. 6). When the casing 230 covers the fitting member 220 and the storage element 110 assembled thereto through the first opening 232, the storage element 110 is moved along the Y-axis until contacting the third stopper part 235, so that the storage element 110 is clamped and fixed by the third stopper part 235 of the casing 230 and the fitting member 220 simultaneously along the Y-axis.

Figure 8:
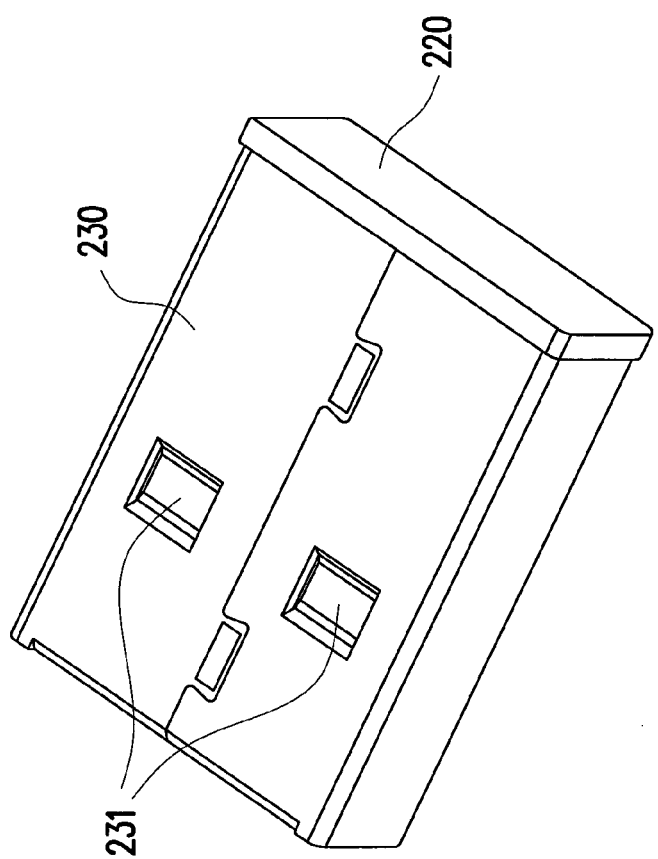
FIG. 8 is a schematic diagram of the storage apparatus depicted in FIG. 6 after being assembled.
Figure 9:
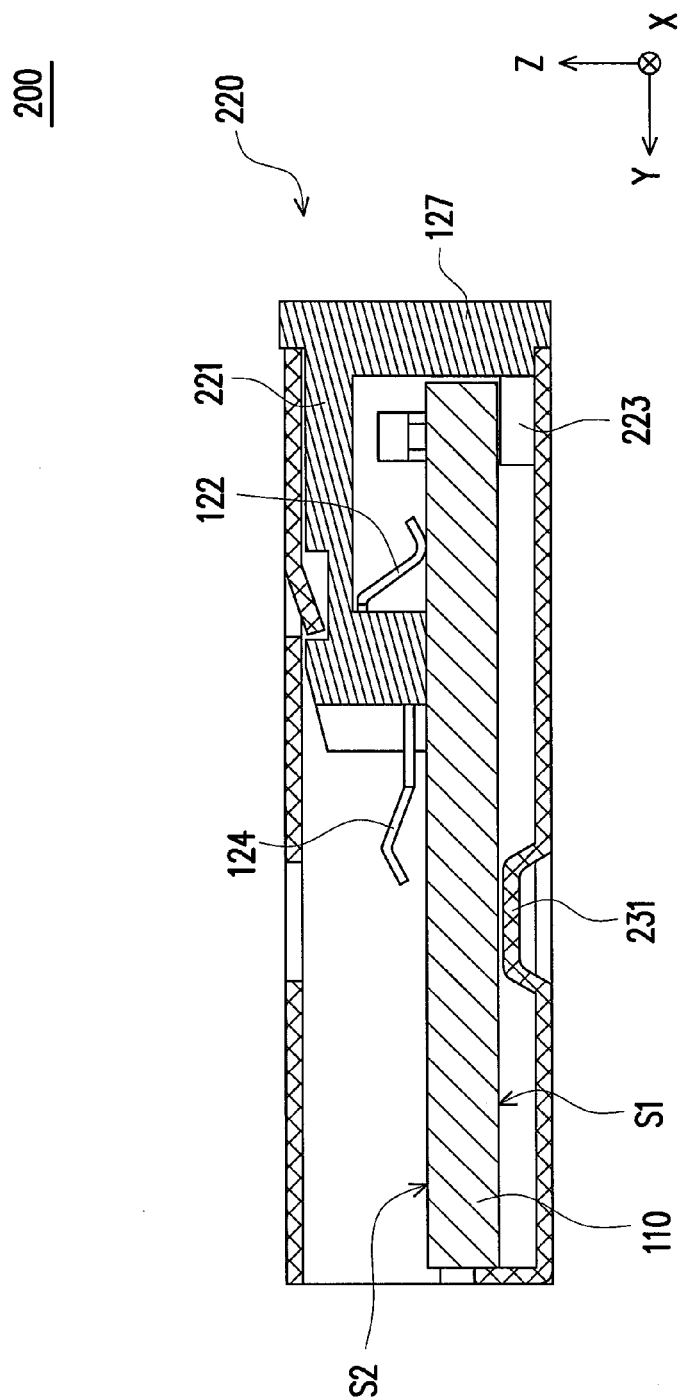
FIG. 9 is a cross-sectional view of the storage apparatus depicted in FIG. 8.

FIG. 8 is a schematic diagram of the storage apparatus depicted in FIG. 6 after being assembled. Here, the bottom of the casing 230 depicted in FIG. 6 is shown in FIG. 8 for clearly illustrating the structural characteristics of the bottom of the casing 230. FIG. 9 is a cross-sectional view of the storage apparatus depicted in FIG. 8. Referring to FIG. 8 and FIG. 9 at the same time, in the present exemplary embodiment, the casing 230 further has a convex hull structure 231. As illustrated in FIG. 9, in the present exemplary embodiment, since an area of orthogonal projection of the carrying part 223 onto the body 112 of the fitting member 220 is smaller than that of the connection part 221 onto the body 112. Thus, the other portion of the storage element 110 unsupported by the carrying part 223 of the storage element 110 is supported by the convex hull structure 231 of the casing 230.

That is, both the convex hull structure 231 and the carrying part 223 simultaneously support the same side of the storage element 110 so that the storage element 110 is sufficiently supported by the casing 230.

To sum up, in the above exemplary embodiments of the present invention, with the storage apparatus simply formed by the fitting member and the storage element, the first terminal set and the second terminal set electrically connected with each other on the fitting member as well as the first pad set and the second pad set of the storage apparatus, the first pad set can serve the second terminal set as a portion of output terminals thereof by utilizing the mutual electrical connection between the first pad set and the first terminal set, such that the second pad set and the second terminal set form the connection interface for the storage apparatus to connect with the external apparatus. In this way, the dimension of the storage apparatus can effectively reduced. In addition, by utilizing the detachably assembly relationship between the fitting member and the storage element, the user can replace the fitting member or the storage element depending on his/her needs, such that the adaptability and the convenience of the storage apparatus can be improved.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A storage apparatus, comprising:
   a storage element, having a body, a first pad set, and a second pad set, wherein the first pad set and the second pad set are exposed out of the body and located at opposite ends of the body; and
   a fitting member, having a first terminal set and a second terminal set electrically connected to each other, and the storage element being detachably assembled to the fitting member,
   wherein the first terminal set and the first pad set are electrically connected to each other, the second terminal set is located between the first pad set and the second pad set, and the second terminal set and the second pad set form a connecting interface used to electrically connect the storage apparatus with an external apparatus,
   wherein the fitting member is a U-shape structure, the fitting member comprises a connection part and a carrying part at opposite sides of the U-shaped structure, the body is located between the connection part and the carrying part so that the storage element is disposed in the U-shaped structure, and the first terminal set and the second terminal set are formed in the connection part and connected with each other.

2. The storage apparatus according to claim 1, wherein the storage apparatus further comprises a third pad set located between the first pad set and the second pad set.

3. The storage apparatus according to claim 2, wherein the third pad set is electrically connected with the first pad set.

4. The storage apparatus according to claim 1, wherein an area of orthogonal projection of the connection part onto the body is smaller than an area of orthogonal projection of the carrying part onto the body.

5. The storage apparatus according to claim 4, wherein the fitting member further comprises a first stopper part disposed on the carrying part and on a first terminal of the U-shaped structure, wherein the storage element is carried on the carrying part and contacts the first stopper part.

6. The storage according to claim 1, wherein an area of orthogonal projection of the connection part onto the body is greater than an area of orthogonal projection of the carrying part onto the body.

7. The storage apparatus according to claim 6, further comprising:
a casing, covering the fitting member and contacting the connection part and the carrying part, and the storage element being contained in the casing,
wherein the casing comprises a convex hull structure, and a first opening and a second opening in an opposite direction to each other, the fitting member further comprises a sealing part located on a second terminal of the U-shaped structure and adjacent to the connection part and the carrying part, the fitting member and the storage element assembled thereto are assembled to the casing through the first opening, so that the sealing part seals the first opening, and storage element are supported by the carrying part and the convex hull structure on one side of the storage element.

8. The storage apparatus according to claim 7, wherein the casing further comprises a third stopper part located in the second opening, and the storage element is assembled into the casing along with the fitting member and contacts the third stopper part.

9. The storage apparatus according to claim 1, wherein the connection part of the fitting member and the storage element form an containing space, the first terminal set and the second pad set which are electrically connected to each other are located in the containing space, and the second terminal set and the second pad set are located outside the containing space.

10. The storage apparatus according to claim 1, further comprising:
a casing, covering the fitting member and contacting the connection part and the carrying part, and the storage element being contained in the casing.

11. The storage apparatus according to claim 10, wherein the casing comprises a first opening and a second opening in an opposite direction to each other and the fitting member further comprises a sealing part located on a second terminal of the U-shaped structure and adjacent to the connection part and the carrying part, the fitting member and the storage element assembled therein are assembled to the casing through the first opening so that the sealing part seals the first opening.

12. The storage apparatus of the claim 1, wherein the second pad set is a connecting interface that conforms to the Universal Serial Bus 2.0 standard.

13. The storage apparatus of the claim 1, wherein the second terminal set and the second pad set form a connecting interface that conforms to the Universal Serial Bus 3.0 standard.

14. The storage apparatus according to claim 1, wherein the first terminal set is an elastic structure.

15. A production method of the storage apparatus according to claim 1, comprising:
assembling the storage element to the fitting member, wherein the first terminal set and the first pad set are electrically connected, the second terminal set is located between the first pad set and the second pad set, and the second terminal set and the second pad set form the connecting interface for the storage apparatus to electrically connect with an external apparatus; and
covering a casing on the fitting member so as to contain the storage element in the casing.

16. The method according to claim 15, wherein the fitting member is a U-shaped structure having a second terminal and a first terminal, the fitting member comprises the connection part and the carrying part at opposite sides of the U-shaped structure, and the production method further comprises:
assembling the storage element into the U-shaped structure from the first terminal toward the second terminal so as to dispose the body between the connection part and the carrying part.

17. The method according to claim 15, wherein the fitting member is a U-shaped structure having a second terminal and a first terminal, the fitting member comprises the connection part and the carrying part at opposite sides of the U-shaped structure, and the production method further comprises:
assembling the storage element into the U-shaped structure from a side between the second terminal and the first terminal so as to dispose the body between the connection part and the carrying part.

18. The method according to claim 15, wherein the casing comprises a first opening and a second opening in an opposite direction to each other, the fitting member is a U-shaped structure having a second terminal and a first terminal and comprises the connection part and the carrying part at opposite sides of the U-shaped structure, and a sealing part located on the second terminal and adjacent to the connection part and the carrying part, and the production method further comprises:
covering the casing on the fitting member through the first opening, and sealing the first opening by the sealing part.

19. The method according to claim 18, wherein the casing comprises a third stopper part located at the second opening; and the production method further comprises:
moving the storage element into the casing from the first opening toward the second opening and contacting the storage element against the third stopper part.

20. The production method according to claim 15 further comprises:
manufacturing the fitting member by utilizing an integral manufacturing technique before assembling the storage element to the fitting member.

* * * * *